United States Patent
Li et al.

(10) Patent No.: US 8,384,573 B2
(45) Date of Patent: Feb. 26, 2013

(54) LOW-POWER DIGITAL-TO-ANALOG CONVERTER

(75) Inventors: Xiaohong Li, Austin, TX (US); Shouli Yan, Austin, TX (US); Zhiheng Cao, San Diego, CA (US)

(73) Assignee: Intellectual Ventures Holding 40 LLC, Las Vegas, NV (US)

( * ) Notice: Subject to any disclaimer, the term of this patent is extended or adjusted under 35 U.S.C. 154(b) by 1321 days.

(21) Appl. No.: 12/122,368

(22) Filed: May 16, 2008
(Under 37 CFR 1.47)

(65) Prior Publication Data

US 2009/0016544 A1    Jan. 15, 2009

Related U.S. Application Data

(60) Provisional application No. 60/938,382, filed on May 16, 2007.

(51) Int. Cl.
*H03M 3/00* (2006.01)
(52) U.S. Cl. .......................... 341/143; 341/144
(58) Field of Classification Search .................. 341/143, 341/150, 118, 120, 153, 154, 172, 144; 375/27, 375/28
See application file for complete search history.

(56) References Cited

U.S. PATENT DOCUMENTS

| | | | |
|---|---|---|---|
| 5,079,550 A | | 1/1992 | Sooch et al. |
| 5,245,344 A | * | 9/1993 | Sooch ............................. 341/150 |
| 5,732,002 A | * | 3/1998 | Lee et al. ....................... 708/313 |
| 6,130,633 A | | 10/2000 | Lee et al. |
| 6,154,158 A | | 11/2000 | Walker |
| 6,373,417 B1 | * | 4/2002 | Melanson ..................... 341/143 |
| 6,404,369 B1 | | 6/2002 | Sheen |
| 7,714,675 B2 | * | 5/2010 | Wang ............................. 332/109 |
| 7,929,714 B2 | * | 4/2011 | Bazarjani et al. ............. 381/111 |
| 2003/0164812 A1 | | 9/2003 | Lee |
| 2006/0028366 A1 | | 2/2006 | Park |
| 2007/0152857 A1 | | 7/2007 | Tu et al. |

OTHER PUBLICATIONS

Notice of Grounds for Rejection, issued in KR Patent Application No. 10-2009-7023759, mailed Apr. 21, 2011, 5 pages.
Annovazzi, M. et al., "A Low-Power 98-dB Multibit Audio DAC in a Standard 3.3-V 0.35-um CMOS Technology," IEEE Journal of Solid-State Circuits, Jul. 2002, pp. 825-834, vol. 37, No. 7.
Fujimori, I. et al., "A Multibit Delta-Sigma Audio DAC with 120-dB Dynamic Range," IEEE Journal of Solid-State Circuits, Aug. 2000, pp. 1066-1073, vol. 35, No. 8.
Li, X. et al., "A Low Power, Low Distortion Single-bit Sigma-Delta Audio DAC with Distributed Feedback from Analog Output," 49th IEEE International Midwest Symposium on Circuits and Systems, Aug. 2006, pp. 17-21.
Thomsen, A. et al., "A 110-dB-THD, 18-mW DAC Using Sampling of the Output and Feedback to Reduce Distortion," IEEE Journal of Solid-State Circuits, Dec. 1999, pp. 1733-1740, vol. 34, No. 12.
Patent Cooperation Treaty, International Search Report and Written Opinion, Sep. 25, 2008, 6 pages.
Office Action, issued in JP Patent Application No. 2010-508616, mailed Nov. 7, 2011, 2 pages.

(Continued)

*Primary Examiner* — Joseph Lauture
(74) *Attorney, Agent, or Firm* — Schwabe, Williamson & Wyatt, P.C.

(57) ABSTRACT

A digital-to-analog converter (DAC) with a digital segment having a digital data input and an analog segment coupled to the digital segment and having an analog output to output an analog signal corresponding to the digital data. The analog segment includes one or more gain stages and a feedback structure to couple the analog output to the one or more gain stages to attenuate signal distortion at the analog output. A combined gain of the one or more gain stages determines a signal distortion attenuation characteristic of the analog segment.

16 Claims, 2 Drawing Sheets

OTHER PUBLICATIONS

International Preliminary Report on Patentability mailed Nov. 17, 2009 in PCT/US2008/063970.

Extended European Search Report for EP Application No. 08755759.1, dated Mar. 30, 2012, 6 pages.

* cited by examiner

LOW-POWER DIGITAL-TO-ANALOG CONVERTER

CROSS REFERENCE TO RELATED APPLICATIONS

This application claims the benefit of U.S. Provisional Application No. 60/938,382, filed May 16, 2007.

TECHNICAL FIELD

The present invention relates to digital circuits, in particular, to a low-power digital-to-analog converter circuit.

BACKGROUND

Generally speaking, high-quality audio applications require high linearity and low in-band noise levels. Thus, in order to avoid overloading speakers, out-of-band noise needs to be reduced to a minimum.

However, it is very difficult to achieve a high signal-to-noise and distortion ratio in audio digital-to-analog converters (DACs) due to different sources of non-linearity and noise. Sources of non-linearity include operational amplifier slew rate limitations, non-linear switch-on resistances, glitches, and others. For audio applications, output stage amplifiers have to consume a large amount of power in order to suppress non-linearity. Two-level and three-level DACs are inherently linear, while multi-bit DACs require dynamic element matching in order to correct non-linearity introduced by component mismatch.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

DETAILED DESCRIPTION OF ILLUSTRATIVE EMBODIMENTS

Figure 1:
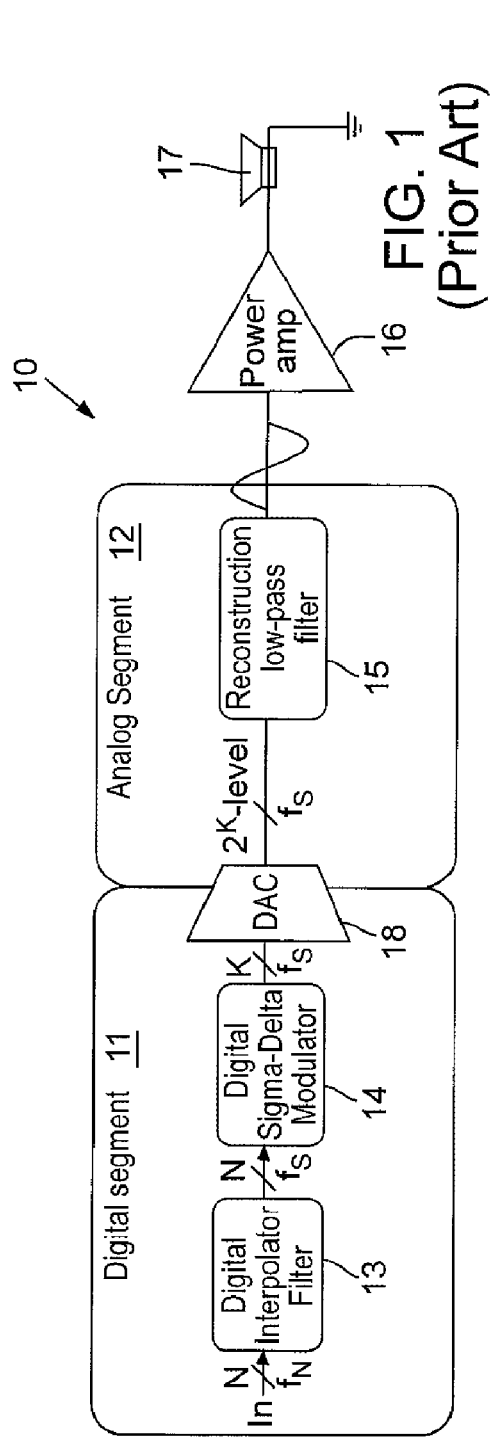
FIG. 1 is a block diagram of an audio digital-to-analog converter, according to the prior art.

In the following detailed description, reference is made to the accompanying drawings which form a part hereof, and in which are shown by way of illustration embodiments in which the invention may be practiced. It is to be understood that other embodiments may be utilized and structural or logical changes may be made without departing from the scope of the disclosure. Therefore, the following detailed description is not to be taken in a limiting sense, and the scope of embodiments is defined by the appended claims and their equivalents.

Various operations may be described as multiple discrete operations in turn, in a manner that may be helpful in understanding embodiments; however, the order of description should not be construed to imply that these operations are order dependent. Also, embodiments may have fewer operations than described. A description of multiple discrete operations should not be construed to imply that all operations are necessary. Also, embodiments may have fewer operations than described. A description of multiple discrete operations should not be construed to imply that all operations are necessary.

The description may use perspective-based descriptions such as up/down, back/front, and top/bottom. Such descriptions are merely used to facilitate the discussion and are not intended to restrict the application of embodiments.

The terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

The description may use the phrases "in an embodiment," or "in embodiments," which may each refer to one or more of the same or different embodiments. Furthermore, the terms "comprising," "including," "having," and the like, as used with respect to embodiments, are synonymous.

In accordance with embodiments of the disclosure, an audio digital-to-analog converter (DAC) circuit may include a digital segment and an analog segment. The digital segment may comprise a digital interpolator filter and a digital sigma-delta modulator. The analog segment may contain a feedback structure—such as for example, a distributed follow-the-leader feedback structure—having multiple switched-capacitors and multiple continuous-time integrators located in a feedback loop to attenuate signal distortion at an output of the DAC circuit.

FIG. 1 depicts a block diagram of an audio digital-to-analog converter (DAC), according to the prior art. As shown, prior art audio DAC 10 includes digital segment 11 and analog segment 12. Digital segment 11 includes digital interpolator filter 13 and digital sigma-delta modulator 14. Analog signal segment 12 includes reconstruction low-pass filter 15. A set of DAC cells 18 is located between digital segment 11 and analog segment 12 for converting digital signals to their analog equivalents. After being amplified by a power amplifier 16, output signals from reconstruction low pass filter 15 are sent to speaker 17. In order to suppress the non-linearity at DAC 10, power amplifier 16 will consume a large amount of power in order to drive speaker 17.

A DAC in accordance with embodiments may be configured to reduce distortions or non-linearity in the output signal by sampling the output voltage of the DAC and by feeding such voltage signals back to the input of the DAC. The non-linearity created by a discrete time-continuous time interface and the output stage of the DAC may be included in the feedback loop. The DAC may then attenuate the non-linearity according to a distortion-reducing characteristic of the DAC, which may be determined by a combined gain characteristic of the DAC. Attenuating the non-linearity in this way may eliminate the need for a high-power output stage to do the same thing.

Figure 2:
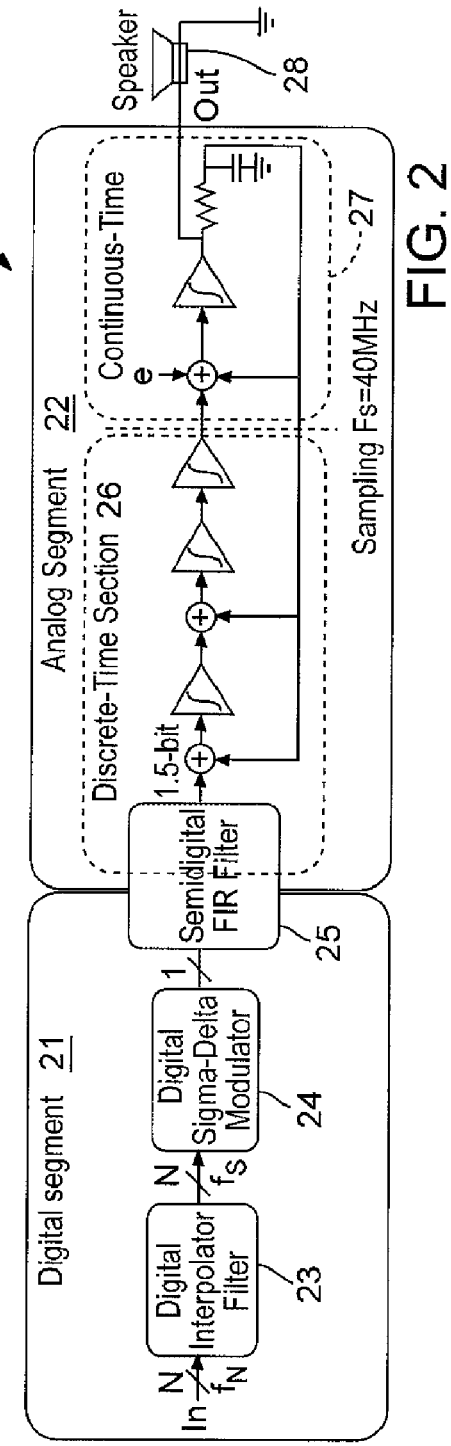
FIG. 2 is a block diagram of an audio digital-to-analog converter, in accordance with embodiments.

With reference now to FIG. 2, there is illustrated a block diagram of an audio DAC, in accordance with embodiments.

As shown, audio DAC 20 may include digital segment 21 and analog segment 22. Digital segment 21 may be coupled to analog segment 22 via finite impulse response (FIR) filter 25 configured to attenuate out-of-band frequency quantization noise. Digital segment 21 may include digital interpolator filter 23 and digital sigma-delta modulator 24. Analog segment 22 may include discrete-time section 26 having multiple discrete-time switched capacitor integrators and continuous-time section 27 having a continuous-time switched capacitor integrator. The input to digital segment 21 may be a single-bit digital data stream (i.e. serialized digital data), and the output from analog segment 22 may be a continuous time analog signal data stream, corresponding to the single-bit digital data stream. Output signals from continuous-time section 27 may be sent to speaker 28. In embodiments, a class AB amplifier configured to reduce the power consumption of DAC 20 may be added before speaker 28.

Figure 3:
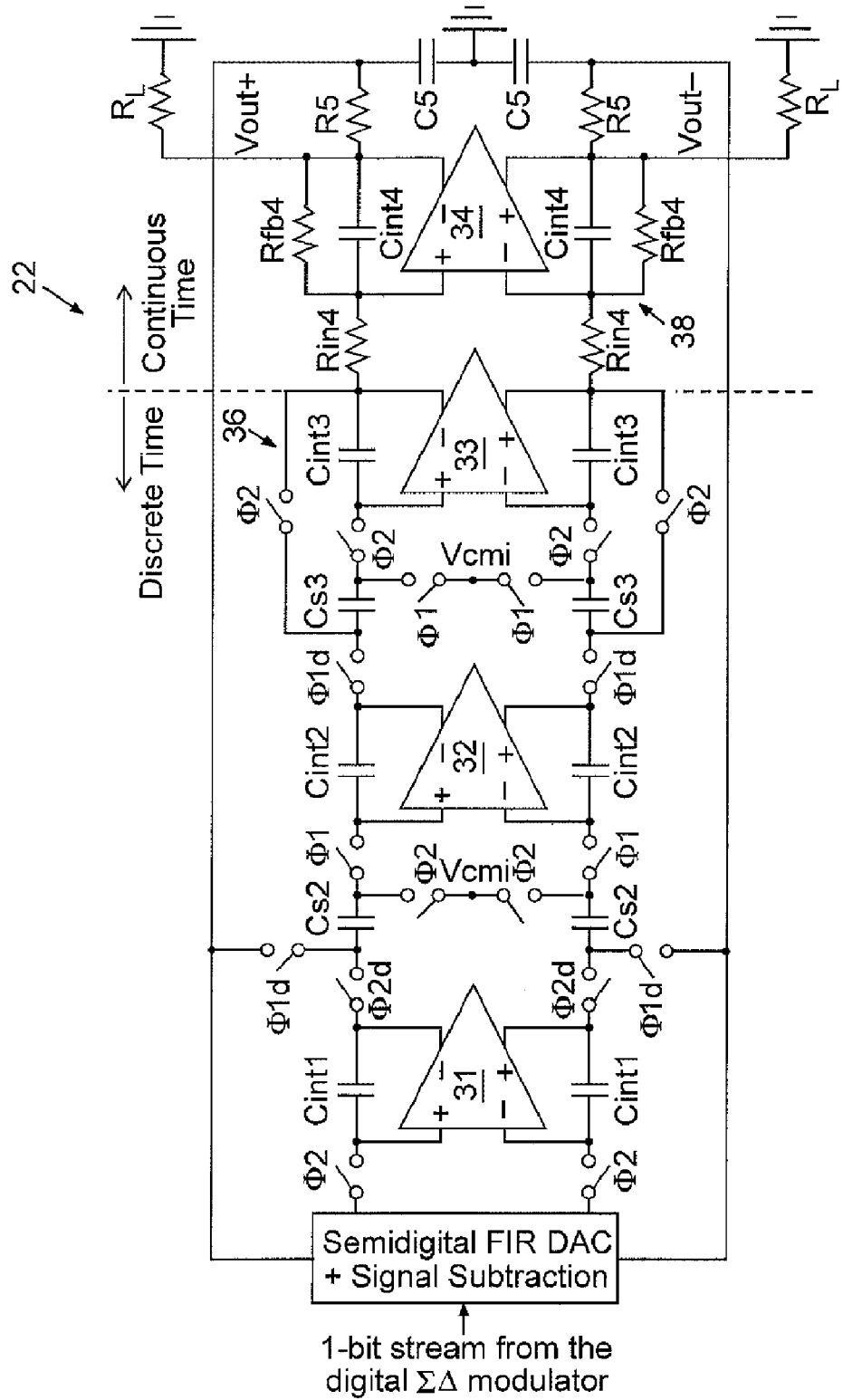
FIG. 3 is a block diagram of an analog segment of an audio digital-to-analog converter in accordance with embodiments.

FIG. 3, illustrates a block diagram of analog segment 22 within a DAC, such as DAC 20 of FIG. 2, in accordance with embodiments. As shown, analog segment 22 may have a modified fourth-order inverse follow-the-leader feedback (IFLF) structure. The first stage of analog segment 22 may include a switched capacitor integrator 31, and the second stage of analog segment 22 may include switched capacitor integrators 32-33. The DC gain of the first and second stages of analog segment 22 may determine the maximum attenuation of feedback distortion in the analog output.

Within the second stage, the capacitance ratio of and $C_s$ and $C_{int}$ may determine the bandwidth of switched capacitor integrators 32-33. For example, if B is the bandwidth of switched capacitor integrators 32-33 and $f_s$ is the sampling frequency of the DAC, then the ratio of $C_s$ over $C_{int}$ may be $B/(2\pi f_s)$.

The third stage of analog segment 22 may be a switched capacitor direct charge transfer unit gain buffer. The third stage may be located between discrete-time switched capacitors 36 and continuous-time integrator 34, followed by single stage passive RC low-pass filter 38. The output-referred noise from the operational amplifiers and switched capacitors within switched capacitor integrators 31-34 may be dominated by the components in the first stage of analog segment 22.

The fourth stage of analog segment 22 may include continuous-time integrator 34. Continuous-time integrator 34 may utilize a class-AB output stage to minimize the power consumption over prior art DACs. The distortion or non-linearity attenuation produced by analog segment 22 may allow the DAC to produce an analog output signal with low non-linearity and/or low in-band noise levels while consuming less power than prior art approaches requiring higher-power outputs to reduce non-linearity. Inclusion of continuous-time integrator 34 may be configured to improve clock jitter and glitch immunity of the DAC.

As has been described, embodiments may provide a low-power audio DAC circuit. Advantages may include a more stable system, outband noise attenuation at higher out-of-band frequencies, and a lower over-sampling ratio and higher bandwidth for a fixed clock frequency.

Although certain embodiments have been illustrated and described herein for purposes of description, it will be appreciated by those of ordinary skill in the art that a wide variety of alternate and/or equivalent embodiments or implementations calculated to achieve the same purposes may be substituted for the embodiments shown and described without departing from the scope of the disclosure. Those with skill in the art will readily appreciate that embodiments of the disclosure may be implemented in a very wide variety of ways. This application is intended to cover any adaptations or variations of the embodiments discussed herein. Therefore, it is manifestly intended that embodiments of the disclosure be limited only by the claims and the equivalents thereof.

What is claimed is:

1. A digital-to-analog converter (DAC) comprising:
   a digital segment having a digital data input configured to receive digital data; and
   an analog segment coupled to the digital segment and having an analog output configured to output an analog signal corresponding to the digital data, wherein the analog segment includes a discrete-time segment and a continuous-time segment, wherein the continuous-time segment is coupled directly to the discrete-time segment at a discrete-time/continuous-time interface, wherein the discrete-time segment comprises one or more gain stages, and wherein the continuous-time segment comprises a continuous-time integrator;
   wherein the analog segment further comprises a feedback structure configured to couple the analog output to the one or more gain stages to attenuate signal distortion at the analog output, and wherein a combined gain of the one or more gain stages is configured to determine a signal distortion attenuation characteristic of the analog segment.

2. The DAC of claim 1, wherein the one or more gain stages are configured to attenuate interface distortion at the analog output produced by the discrete-time/continuous-time interface.

3. The DAC of claim 2, wherein the one or more gain stages comprise one or more switched-capacitor integrators.

4. The DAC of claim 1, wherein the continuous-time integrator comprises a class AB output stage.

5. The DAC of claim 1, wherein the digital segment and the analog segment are coupled by a finite impulse response filter configured to attenuate out-of-band frequency quantization noise.

6. The DAC of claim 1, wherein the analog segment further comprises a class AB output stage.

7. The DAC of claim h wherein the feedback structure comprises an inverse follow-the-leader feedback structure.

8. An audio system comprising:
   a speaker; and
   a digital-to-analog-converter (DAC) having an analog output coupled to the speaker, wherein the DAC includes:
      a digital segment having a digital data input configured to receive a digitized audio data stream; and
      an analog segment coupled to the digital segment and configured to convert digital signals from the digital segment into corresponding analog signals to be converted to audio by the speaker, wherein the analog segment comprises an analog output, a discrete-time segment, and a continuous-time segment, wherein the continuous-time segment is coupled directly to the discrete-time segment at a discrete-time/continuous-time interface, wherein the discrete-time segment includes one or more gain stages, and wherein the continuous-time segment includes a continuous-time integrator;
      wherein the analog segment further comprises a feedback structure configured to couple the analog output to the one or more gain stages to attenuate non-linearity in the corresponding analog signal at the analog output, and wherein a combined gain of the one or more gain stages is configured to determine a signal non-linearity attenuation.

9. The audio system of claim 8, wherein the continuous-time integrator comprises a class AB output stage.

10. The audio system of claim 8, wherein the one or more gain stages are configured to attenuate interface non-linearity at the analog output caused by the discrete-time/continuous-time interface.

11. The audio system of claim 8, wherein the digital segment and the analog segment are coupled by a finite impulse response filter configured to attenuate out-of-band frequency quantization noise.

12. The audio system of claim 8, wherein the analog segment further comprises a class AB output stage.

13. The audio system of claim 8, wherein the feedback structure comprises an inverse follow-the-leader feedback structure.

14. The audio system of claim 8, wherein the DAC comprises a sigma-delta DAC.

15. A digital-to-analog conversion method comprising:

propagating a digital signal through an analog segment to generate an analog signal, wherein the analog segment includes a discrete-time segment and a continuous-time segment, wherein the continuous-time segment is coupled directly to the discrete-time segment at a discrete-time/continuous-time interface, wherein the discrete-time segment comprises one or more gain stages, and wherein the continuous-time segment comprises a continuous-time integrator; and feeding the analog signal back to the one or more gain stages to attenuate distortion of the analog signal, wherein the one or more gain stages are configured to determine a signal distortion attenuation characteristic of the analog segment.

16. The method of claim 15, wherein said feeding the analog signal back comprises feeding back in an inverse follow-the-leader feedback manner.

\* \* \* \* \*

UNITED STATES PATENT AND TRADEMARK OFFICE
CERTIFICATE OF CORRECTION

PATENT NO. : 8,384,573 B2
APPLICATION NO. : 12/122368
DATED : February 26, 2013
INVENTOR(S) : Li et al.

Page 1 of 1

It is certified that error appears in the above-identified patent and that said Letters Patent is hereby corrected as shown below:

In the Specification

In Column 1, Line 5, delete "APPLICATIONS" and insert -- APPLICATION --, therefor.

In Column 3, Line 18, delete "FIG. 3, illustrates" and insert -- FIG. 3 illustrates --, therefor.

In the Claims

In Column 4, Line 39, in Claim 7, delete "claim h" and insert -- claim 1, --, therefor.

In Column 4, Line 43, in Claim 8, delete "digital-to-analog-converter" and insert -- digital-to-analog converter --, therefor.

Signed and Sealed this
Fourth Day of March, 2014

Michelle K. Lee
*Deputy Director of the United States Patent and Trademark Office*